(12) United States Patent
Zhu

(10) Patent No.: US 6,807,033 B2
(45) Date of Patent: Oct. 19, 2004

(54) MAGNETIC SENSOR WITH REDUCED WING REGION MAGNETIC SENSITIVITY

(75) Inventor: Jian-Gang Zhu, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 200 days.

(21) Appl. No.: 10/055,435

(22) Filed: Jan. 23, 2002

(65) Prior Publication Data

US 2002/0101691 A1 Aug. 1, 2002

(51) Int. Cl.$^7$ ................................................ G11B 5/39
(52) U.S. Cl. ................................ 360/324; 360/324.12
(58) Field of Search ..................... 360/324.12, 324.1, 360/324, 324.2

(56) References Cited

U.S. PATENT DOCUMENTS

| | | | |
|---|---|---|---|
| 6,094,325 A | 7/2000 | Tagawa et al. | |
| 6,108,176 A | 8/2000 | Yokoyama | |
| 6,178,072 B1 | 1/2001 | Gill | |
| 6,204,071 B1 * | 3/2001 | Ju et al. | 438/3 |
| 6,219,207 B1 | 4/2001 | Pinarbasi | |
| 6,221,518 B1 | 4/2001 | Araki et al. | |
| 6,222,707 B1 | 4/2001 | Huai et al. | |
| 6,249,406 B1 | 6/2001 | Gill et al. | |
| 6,266,218 B1 * | 7/2001 | Carey et al. | 360/324.12 |
| 6,315,839 B1 | 11/2001 | Pinarbasi et al. | |
| 6,330,128 B1 | 12/2001 | Chang et al. | |
| 6,430,015 B2 * | 8/2002 | Ju et al. | 360/327.32 |
| 6,462,919 B1 * | 10/2002 | Mack et al. | 360/327.3 |
| 6,501,627 B2 * | 12/2002 | Noma et al. | 360/324.12 |
| 6,570,745 B1 * | 5/2003 | Gill | 360/324.12 |
| 2001/0003862 A1 | 6/2001 | Dugas | |
| 2001/0004306 A1 | 6/2001 | Lee et al. | |
| 2001/0048578 A1 | 12/2001 | Yamaguchi et al. | |
| 2003/0133233 A1 * | 7/2003 | Gill | 360/324.12 |

* cited by examiner

Primary Examiner—William Klimowicz
(74) Attorney, Agent, or Firm—Kirkpatrick & Lockhart LLP

(57) ABSTRACT

A magnetic sensor. According to one embodiment, the sensor comprises a synthetic antiferromagnetic (SAF) layer having first and second wing regions and an active region therebetween. The SAF layer includes a non-magnetic metal layer having first and second wing region portions and an active region portion therebetween, the non-magnetic metal layer including first and second opposing surfaces. The SAF layer also includes a first ferromagnetic layer adjacent a first surface of the non-magnetic metal layer and having first and second wing region portions and an active region portion therebetween. The SAF layer further includes a second ferromagnetic layer adjacent the second surface of the non-magnetic metal layer and including a first wing region portion adjacent the first wing region portion of the non-magnetic metal layer and a second wing region portion adjacent the second wing region portion of the non-magnetic metal layer. The second ferromagnetic layer is of adequate thickness such that the magnetic susceptibility of the first and second wing region portions of the first ferromagnetic layer is substantially zero when magnetic fields are present only in the first and second wing regions.

13 Claims, 12 Drawing Sheets

Signal Field, H

MAGNETIC SENSOR WITH REDUCED WING REGION MAGNETIC SENSITIVITY

BACKGROUND OF INVENTION

Giant magnetoresistive (GMR) materials are materials whose electrical resistance changes when brought in contact with a magnetic field. Because of this property, GMR materials are often used in the read element of a read/write head used to read data recorded on a high-density magnetic disk. Unlike inductive heads in which the data bit on the medium induces the current across a gap, the GMR mechanism is an active element with current flowing through it. The magnetic orientation of the bit increases the resistance in a thin-film, magnetic layer of the GMR read head, and a read circuit coupled to the GMR read head detects the difference in current due to the increased resistance. Because GMR heads are more sensitive to weaker fields than the earlier inductive read coils, GMR read heads are widely used in magnetic data storage systems because as storage capacity increases, the bit gets smaller and its magnetic field becomes weaker.

GMR heads typically include additional thin films in the sensing element to facilitate the change in resistance caused by a magnetic field. A typical GMR read head includes a GMR sensing layer sandwiched between two shield layers. The GMR sensing layer is typically formed in a patterned multilayer structure including at least a non-magnetic metal layer sandwiched by two ferromagnetic layers. When the magnetic moments of the ferromagnetic layers are parallel, the GMR sensing layer has a low electrical resistance. Conversely, when the magnetic moments of the ferromagnetic layers are anti-parallel, the GMR sensing layer has a high electrical resistance. The resolution of the read element is inversely proportional to the distance (or gap) between the shield layers. Accordingly, the smaller the gap (or window), the greater the resolution of the read element, hence permitting the data to be recorded more densely on the recording medium.

One known type of high-density read head design including a GMR sensing layer is a spin valve read head. In this structure, at least one anti-ferromagnetic layer is formed adjacent to one of the ferromagnetic layers of the GMR sensing layer to pin the magnetization of that ferromagnetic layer such that the direction of the magnetic spin of the pinned ferromagnetic layer is fixed in the range of several tens to several hundreds Oersted (Oe) in magnetic field. On the other hand, the direction of the magnetic spin of the free ferromagnetic layer is freely varied by an external magnetic field. As a result, there can be achieved a magnetoresistance change ratio of two to five percent in a small magnetic field range.

According to spin valve read head designs, the anti-ferromagnetic layer must be sufficiently sized to pin the magnetization of the pinned ferromagnetic layer. Accordingly, there is a practical limit to how thin the anti-ferromagnetic layer may be fabricated, preventing further reduction of the shield-to-shield spacing, hence limiting the linear recording density. For current spin valve and advanced spin valve head designs, the anti-ferromagnetic layer typically has a thickness greater than 15 nm. As a result, the width of the GMR element of current and advanced spin valve head designs is ordinarily 30 nm or greater, which is too wide for higher density applications, such as on the order of 100 Gbits/sq inch.

In addition, with current spin valve head designs the wing region of the GMR element may detect the magnetic field from a track adjacent to the track being read by the active region of the GMR element. This phenomenon is sometimes referred to as "side-reading" and is undesirable because it increases the magnetic susceptibility of the read head. In current GMR read heads it is difficult to suppress side-reading yet maintain the sensitivity of the active region of the GMR element. This is an especially acute problem, as increasingly narrower active regions are needed as storage densities continue to increase.

BRIEF SUMMARY OF THE INVENTION

According to one embodiment, the present invention is directed to a magnetic sensor. The magnetic sensor includes a synthetic antiferromagnetic (SAF) layer having first and second wing regions and an active region therebetween. The SAF layer includes two ferromagnetic layers and a non-magnetic metal layer therebetween such that there exists an anti-parallel magnetic coupling between the two ferromagnetic layers.

The second ferromagnetic layer is only patterned onto the non-magnetic metal layer in the wing region portions thereof and is of adequate thickness such that the magnetic susceptibility of the wing region portions of the first ferromagnetic layer is substantially zero when a magnetic field is present only in the wing regions.

The magnetic sensor may be used in various devices such as, for example, spin valve (CIP/GMR) read heads, tunnel junction heads, and CPP/GMR read heads.

BRIEF DESCRIPTION OF THE DRAWINGS

Embodiments of the present invention are described in conjunction with the following figures, wherein.

DETAILED DESCRIPTION OF THE INVENTION

It is to be understood that the figures and description have been simplified to illustrate elements that are relevant for a clear understanding of the present invention while eliminating, for purposes of clarity, other elements of a magnetic sensor. For example, details of the read circuit are not described herein. Those of ordinary skill in the art will recognize, however, that these and other elements may be desirable in a typical magnetic sensor. However, because such elements are known in the art and because a further description of them does not facilitate a better understanding of the present invention, a discussion of such elements is not provided herein. In addition, the figures are not drawn to precise scale.

According to one embodiment, the present invention is directed to a magnetic sensor. One embodiment of a magnetic sensor according to the present embodiment is described in conjunction with FIGS. 1 and 2, which illustrate a spin valve read head 10 including the magnetic sensor of the present invention. A spin valve read head is sometime referred to as a CIP (current-in-plane) GMR read head. Although the magnetic sensor of the present invention is described in conjunction with FIGS. 1 and 2 as a spin valve read head, the magnetic sensor of the present invention may be used in other types of magnetic devices such as, for example, a tunnel junction head or a CPP (current-perpendicular-to-plane) GMR read head.

Figure 1:
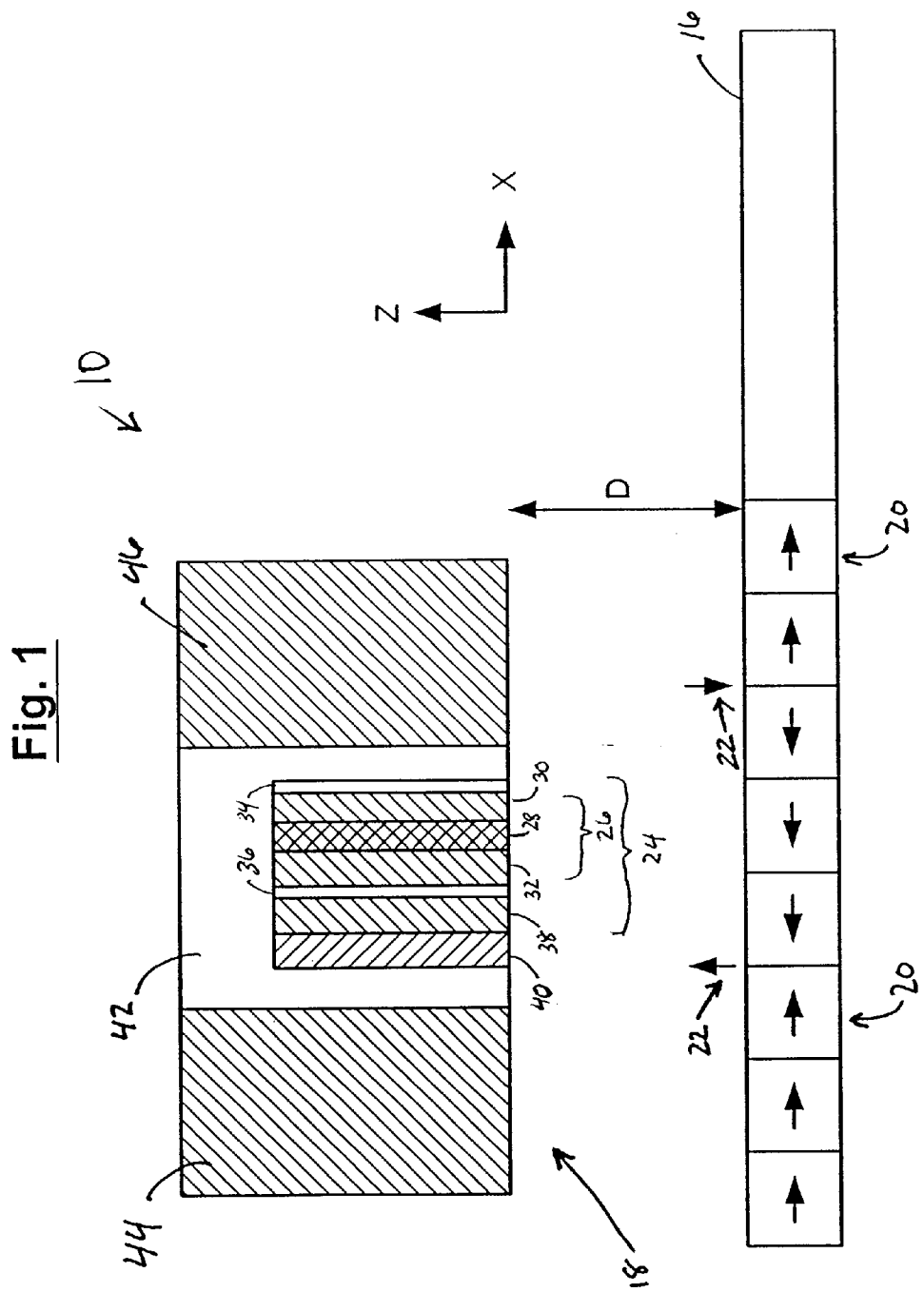
FIG. 1 is a cross-sectional side view of a magnetoresistive read head according to one embodiment of the present invention.
Figure 2:
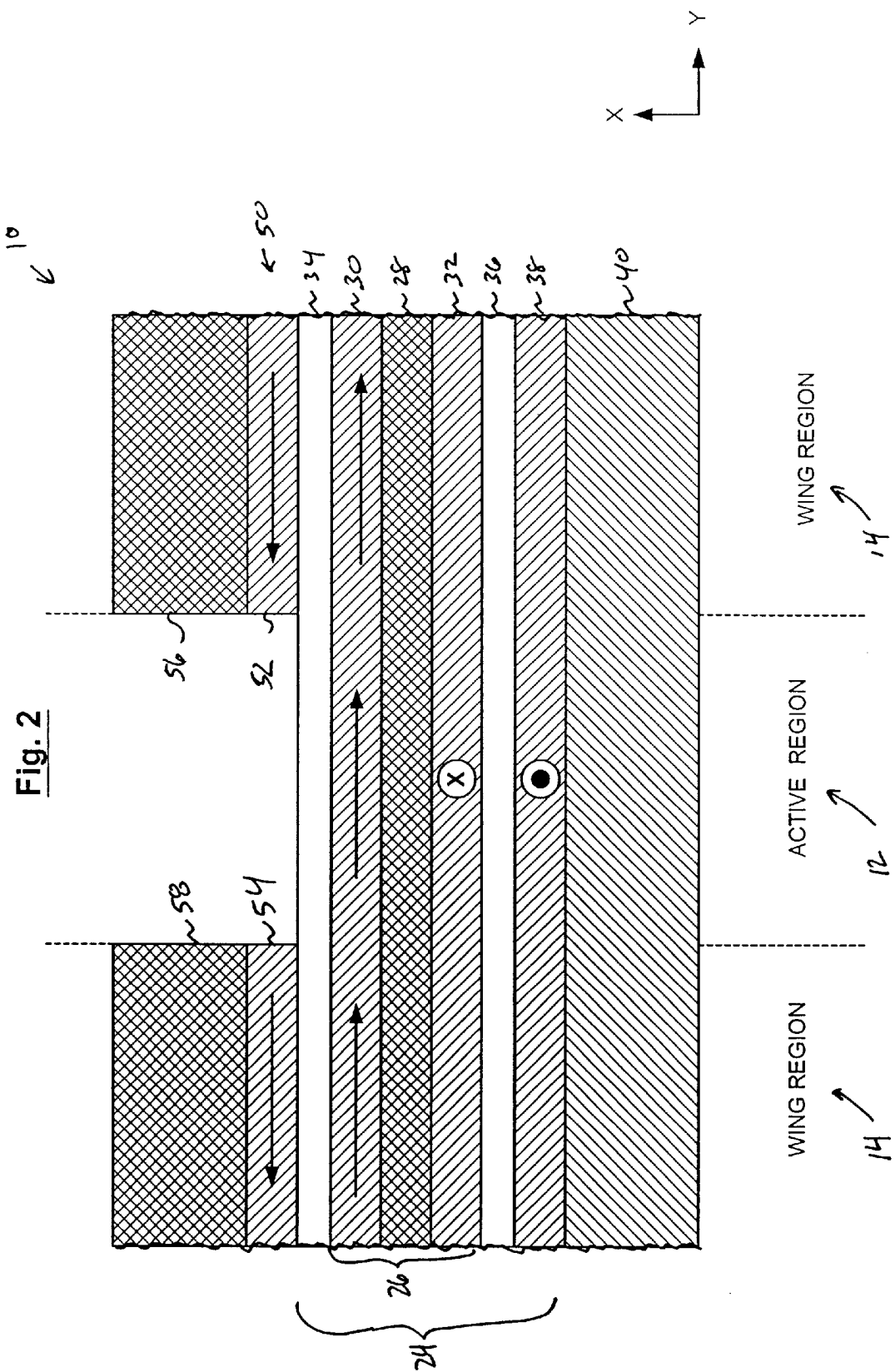
FIG. 2 is a bottom-view of the read head of FIG. 1 according to one embodiment of the present invention.

FIG. 1 is a cross-sectional side view of the read head 10 and FIG. 2 is a bottom view of the read head 10. As seen in FIG. 2, the read head 10 may include an active region 12 and two adjacent wing regions 14. FIG. 1 is a cross-sectional view of the active region 12 of the read head 10.

The read head 10 may be used to read data from a magnetic medium 16 adjacent to a lower surface 18 of the read head 10. The magnetic medium 16 may include a number of pre-oriented flux regions 20 defined on its surface, each directed in either the +X or −X direction relative to the Cartesian coordinate grid shown in FIG. 1. Opposingly-oriented flux regions 20 of the medium 16 define transitions, such as transition 22, illustrated in FIG. 1, which produce magnetic fringe fields extending in the +Z and −Z directions respectively beyond the medium 16. The read head 10 may be positioned in an air bearing slider (not shown) in order that the magnetic sensor 10 may move relative to the magnetic medium 16 along the +/−X direction at an aerodynamically-defined distance D. As the read head 10 moves relative to the medium 16, a magnetoresistive element 24, such as a giant magnetoresistive element (GMR) element, detects the fringe fields produced by opposingly-oriented flux regions 20, thereby causing a change in the electrical resistance of the magnetoresistive element 24. The change in electrical resistance of the magnetoresistive element 24 may be detected by a read circuit (not shown) of the read head 10. According to one embodiment, the read circuit may send a reference current through the magnetoresistive element such that reference current may pass through the magnetoresistive element 24 in a so-called "CIP" (Current In Plane) mode.

Only one track of the magnetic medium 16 is shown in FIG. 1. Typically the magnetic medium 16 includes a number of adjacent tracks. With reference to the Cartesian coordinate grids of FIGS. 1 and 2, the adjacent tracks would be positioned in the medium 16 in the +/−Y directions relative to the track shown in FIG. 1. The active region 12 of the read head 10 moves along the track of the magnetic medium 16 being read to read the data thereon. The immediately adjacent tracks are therefore adjacent to the wing regions 14. As the recording density of magnetic media continues to trend higher, such as towards 100 Gbits/sq. inch, the track width necessarily must decrease.

According to one embodiment, the magnetoresistive element 24 is a GMR element. Accordingly, hereinafter the magnetoresistive element 24 is referred to as GMR element 24 for purposes of convenience.

The GMR element 24, according to one embodiment, includes a so-called GMR tri-layer 26 including a non-magnetic metal layer 28 and adjacent ferromagnetic layers 30, 32. The non-magnetic metal layer 28 may be fabricated from an electrically conductive/magnetically non-conductive material such as, for example, copper, and may have a thickness (in the +/−X direction) of, for example, less than 50 Å and, according to one embodiment, may be approximately 20 Å. The ferromagnetic layers 30, 32 may include a magnetic material such as, for example, nickel-iron (NiFe) or cobalt-iron (CoFe). Other materials may also be included in the ferromagnetic layers 30, 32. According to one such embodiment, the ferromagnetic layers 30, 32 may include a nickel-iron-cobalt (NiFeCo) alloy (as well as additional materials). Each layer 30, 32 may have a thickness of, for example, less than 50 Å and, according to one embodiment, may be approximately 20 Å.

For a tunnel junction device, the GMR tri-layer 26 is replaced with a tunnel junction tri-layer (not shown). A tunnel junction tri-layer is similar to a GMR tri-layer except that the non-magnetic metal layer in the middle of the GMR tri-layer is replaced with an electrically insulating layer such as, for example, $Al_2O_3$.

Also as illustrated in FIGS. 1 and 2, the GMR element 24 may include metal layers 34, 36 adjacent to the GMR tri-layer 26. The metal layers 34, 36 may be fabricated from a non-magnetic metal such as, for example, ruthenium (Ru) or rhodium (Rd), and may have a thickness of, for example, 20 Å or less. According to one embodiment, the non-magnetic metal layers 34, 36 may have a thickness of between 6 and 12 Å.

The GMR element 24 may also include an additional ferromagnetic layer 38 adjacent to the metal layer 36. Like ferromagnetic layer 32, the ferromagnetic layer 38 may include, for example, NiFe or CoFe, and may have a thickness of less than 50 Å. As illustrated in FIG. 2, the ferromagnetic layers 32, 38 may have anti-parallel magnetizations due to the non-magnetic metal layer 36. According to one embodiment, the read head 10 may include an antiferromagnetic layer 40 adjacent to the magnetic layer 38 to pin the magnetization of the ferromagnetic layer 38. The antiferromagnetic layer 40 may include, for example, IrMn.

As illustrated in FIG. 1, the read head 10 may also include an insulating layer 42 and two shield layers 44, 46. The shield layers 44, 46 may be fabricated, for example, from a soft magnetic material such as, for example, nickel-iron (NiFe). The insulating layer 42 may be fabricated from an electrically non-conductive material such as, for example, aluminum oxide ($Al_2O_3$) and may have a sufficient thickness to prevent the conduction of electrical current between the GMR element 24 and the shield layers 44, 46. According to one embodiment, the insulating layer 42 may have a thickness of, for example, approximately 16 nm (160 Å). For purposes of convenience, the shield layer 44, 46 and the insulating layer 42 are not shown in FIG. 2.

As illustrated in FIG. 2, the wing regions 14 of the read head 10 may include an additional ferromagnetic layer 50, comprising wing region portions 52, 54, patterned on the metal layer 34. The ferromagnetic layer 50 may include a cobalt alloy such as, for example, CoFe.

The combination of the two ferromagnetic layers 30, 50 with the non-magnetic metal layer 34 therebetween yields what is referred to as a synthetic antiferromagnetic layer (SAF). The thinness of the non-magnetic metal layer 34 promotes antiferromagnetic exchange between the ferromagnetic layers 30, 50. As a result, the ferromagnetic layers 30, 50 have anti-parallel magnetizations, as illustrated in FIG. 2. In addition, as described in more detail hereinafter, the ferromagnetic layer 50 may be of a sufficient thickness such that the wing regions of ferromagnetic layer 30 effectively have a magnetic permeability equal to that of free space and such that the magnetic flux from the magnetic medium 16 underneath the wing regions 14 of the read head 10 yields substantially no magnetization rotation in the ferromagnetic layer 30. According to one embodiment, the ferromagnetic layer 50 has a thickness of 3 to 4 nm. Hereinafter, the ferromagnetic layer 50 is sometimes referred to as the "patterned layer 50" and the ferromagnetic layer 30 is sometimes referred to as the "free layer 30."

As further illustrated in FIG. 2, the read head 10 may also include electrically conductive leads 56, 58 patterned onto the wing region portions 52, 54 of the patterned layer 50 respectively. The leads 56, 58 may provide an electrical connection between the GMR element 24 and the read circuit (not shown) used to detect changes in the electrical resistance of the GMR element 24 caused by the transitions 22 in the opposingly-oriented flux regions 20. The insulating layer 42 (not shown in FIG. 2) may be patterned on the metal layer 34 in the active region 12 of the read head 10 between the wing region portions 52, 54 of the patterned layer 50 and between the leads 56, 58.

The read head 10 may be formed, for example, by depositing the various layers according to conventional processing techniques. The patterned layer 50 may be formed, for example, by depositing the ferromagnetic layer 50 and a conductive layer for the leads 56, 58. The ferromagnetic layer 50 and the conductive layer may then be etched to remove the layers from the active region 12 and to define the wing region portions 52, 54 of the ferromagnetic layer 50 and the leads 56, 58. Thereafter, the insulating layer 42 may be deposited in the opening between the wing region portions 52, 54 of the ferromagnetic layer 50 and the leads 56, 58.

With the patterned layer 50 of a sufficient thickness, as described in more detail hereinafter, the wing region portions of the free layer 30 will effectively have a magnetic permeability equal to that of free space and the magnetic flux from tracks of the medium 16 underneath the wing regions 14 of the read head 10 (i.e., the adjacent tracks not being read) will yield virtually no magnetization rotation in the free layer 30. That is, the wing regions 14 of the GMR element 24 will have substantially no magnetic sensitivity and produce no resistance change. As a result, the effective track width of the medium 16 may be solely limited by lithographic patterning of the active region 12 of the read head. The effective track width for the present invention may be very similar to the physical track width, defined by the patterning, even at track widths as narrow as 50 nm.

Figure 3:
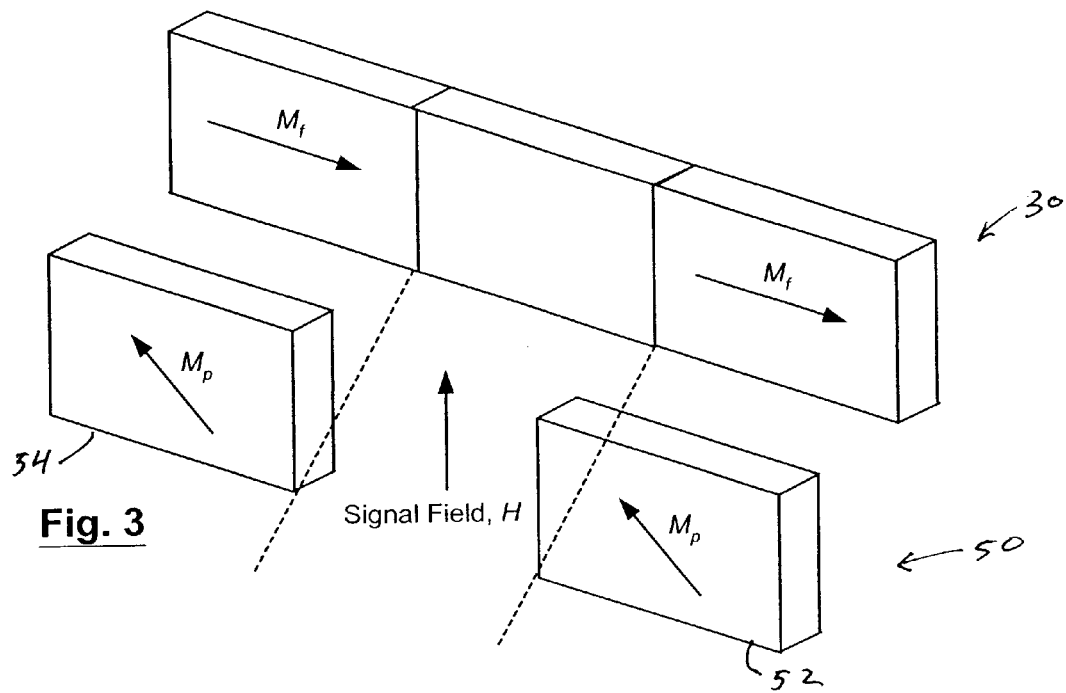
FIG. 3 is a diagram illustrating the torques on the magnetic moment in a wing region of the free and patterned layers of the read head according to one embodiment.

The patterned layer 50 may introduce an additional torque on magnetic moment of the free layer 30 in the wing regions 14 to counter-balance the torque introduced by the signal field in the wing regions. As shown in FIG. 3 with respect to wing region portions 52, 54, the signal field in the wing region generates a torque on the magnetic moment of the wing region portions 52, 54 of the patterned layer 50, forcing it to rotate towards the direction of the signal field if it is chosen to be thicker than the free layer 30. If the thickness of the patterned layer 50 is chosen correctly, the torque generated via the interlayer ferromagnetic coupling of the free layer 30 can be exactly the same magnitude as the torque on the magnetic moment of the free layer 30 generated by the signal field, but in the opposite direction. The canceling between the two torques yields no magnetization rotation in the free layer 30, thereby providing zero magnetic susceptibility in the wing regions when a magnetic signal field in present in only the wing regions.

Figure 4:
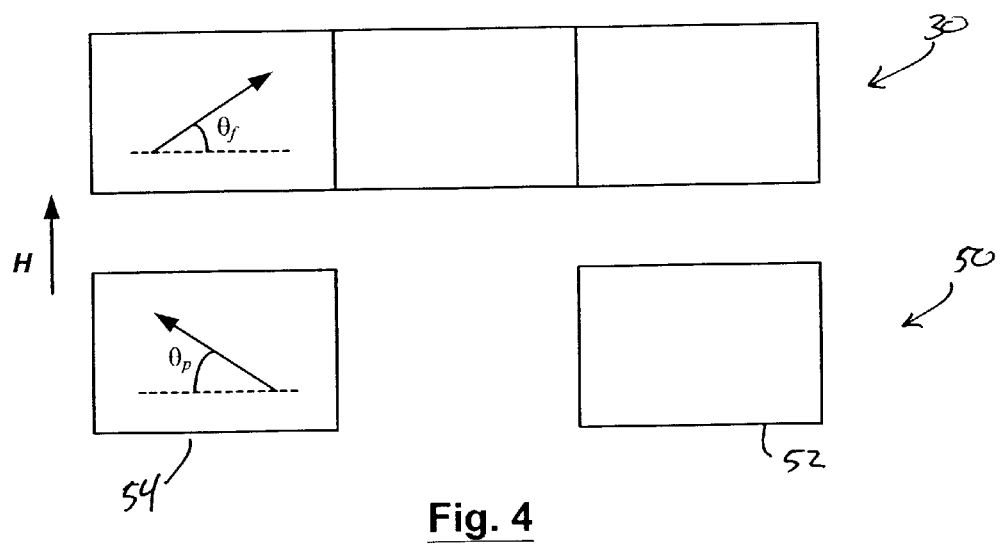
FIG. 4 is a diagram of the free and patterned layers of the read head.

With reference to the geometric parameters illustrated in FIG. 4, the thickness for the patterned layer 50 to achieve a magnetic susceptibility of zero in the wing region portions of the free layer 30 is now provided.

The surface energy density, E, at the wing regions may be written as:

$$E = -A\cos(\theta_f + \theta_p) + K_f \delta_f \sin^2\theta_f + K_p \delta_p \sin^2\theta_p - HM_{s,f}\delta_f \sin\theta_f - HM_{s,p}\delta_p \sin\theta_p \quad (1)$$

where A is the antiparallel interlayer exchange coupling constant, $K_f$ and $K_p$ are the effective magnetic anisotropy density for the free layer 30 and the patterned layer 50 respectively, $\delta_f$ and $\delta_p$ are the thickness of the free layer 30 and the patterned layer 50 respectively, $M_{s,f}$ and $M_{s,p}$ are the saturation magnetizations of the free and patterned layers respectively, and H is the magnetic signal field strength.

At equilibrium, the following conditions exist:

$$\frac{\partial E}{\partial \theta_f} = 0 \quad \text{and} \quad \frac{\partial E}{\partial \theta_p} = 0 \quad (2)$$

For $\theta_f \ll 1$ and the following may be obtained:

$$\theta_f = -\frac{H \cdot [(H_{e,f} - H_{e,p}) - H_{k,p}]}{H_{e,p}H_{k,f} + (H_{e,f} + H_{k,f})H_{k,p}} \quad \text{and} \quad (3)$$

$$\theta_p = -\frac{H \cdot [H_{k,f} + (H_{e,f} - H_{e,p})]}{H_{e,p}H_{k,f} + (H_{e,f} + H_{k,f})H_{k,p}} \quad (4)$$

where $$H_{e,f} = \frac{A}{M_{s,f}\delta_f}, \; H_{e,p} = \frac{A}{M_{s,f}\delta_f}, \; H_{k,f} = \frac{2K_f}{M_{s,f}}, \; \text{and} \; H_{k,p} = \frac{2K_p}{M_{s,p}}.$$

For an embodiment that is side-reading free, then $\theta_f = 0$, which implies:

$$\theta_f = -\frac{H \cdot [(H_{e,f} - H_{e,p}) - H_{k,p}]}{H_{e,p}H_{k,f} + (H_{e,f} + H_{k,f})H_{k,p}} = 0 \quad (5)$$

Accordingly, the thickness for the patterned layer 50 to achieve a side-reading free embodiment is:

$$\delta_p M_{s,p} = \frac{\delta_f M_{s,f}}{1 - \frac{H_{k,p}}{H_{e,f}}} \quad (6)$$

For $H_{e,f} \gg H_{k,p}$, $$\delta_p M_{s,p} = \delta_f M_{s,f}\left(1 + \frac{H_{k,p}}{H_{e,f}}\right) \quad (7)$$

Therefore, there exists a thickness for the patterned layer ($\delta_p$) to effectively eliminate side reading and where the area moment density of the patterned layer 50 is greater than that of the free layer 30. In addition, no exchange pinning is necessary for suppressing the side reading. That is, according to one embodiment of the present invention, no antiferromagnetic layer is need for exchange pinning the wing regions of the ferromagnetic layer 30. If the patterned layer 50 is not patterned to have precisely the calculated thickness, the magnetic susceptibility of the wing region portions of the ferromagnetic layer 30 will not be zero, but as long as the patterned layer 50 is substantially close to the calculated thickness, such as within standard fabrication processing margins, then the magnetic susceptibility of the wing region portions of the ferromagnetic layer 30 will be substantially zero.

Figure 5:
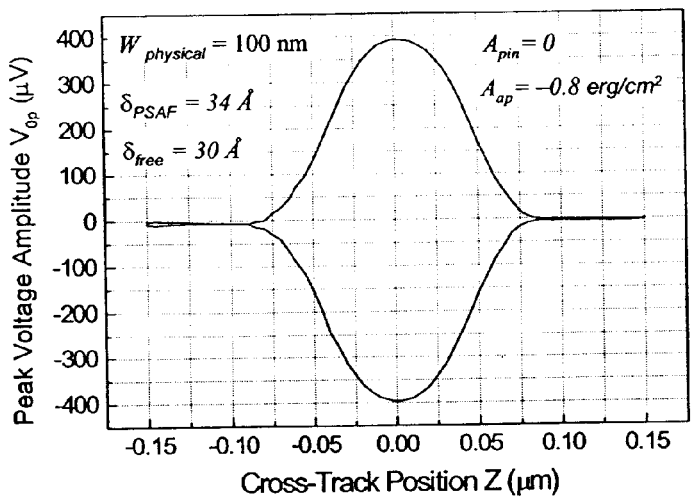
FIGS. 5–7 are graphs illustrating micro-track profile simulation results for varying thickness of the patterned layer.
Figure 6:
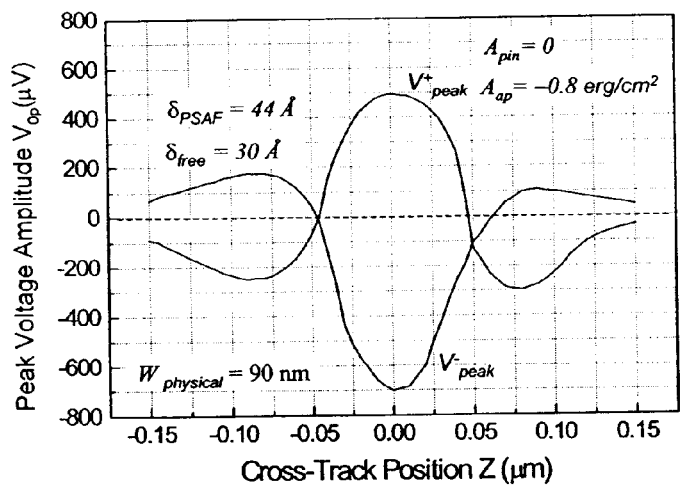
Figure 7:
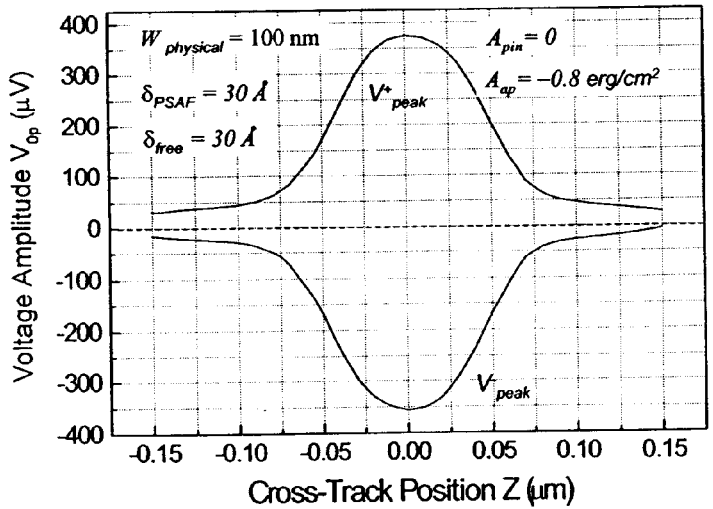

FIGS. 5–7 illustrate micro-track profile simulation results for varying thickness of the patterned layer 50. For the simulations, the effective read track width, measured as FWHM (Full Width at Half Maximum), is 89 nm, while the physical track width ($W_{physical}$), defined by the patterning, is 100 nm. At a 50 nm physical track width, the effective read track width is actually 55 nm, only a slight broadening. In all of the simulations, the sense current is assumed to flow in the entire length of the GMR element 24 in the cross-track direction, purposefully for examining the side-reading effect. In addition, for each simulation the saturation magnetization of the free layer 30 and the patterned layer 50 are the same, $$M_{s,f} = M_{s,p} = 1000 \text{ emu/cm}^3.$$

For the simulation of FIG. 5, the thickness of the patterned layer 50 ($\delta_{PSAF}$) is 34 Å. As can be seen, for such an embodiment the read head exhibits substantially no side reading at more the 0.8 µm off the center-track position. In FIG. 6, the thickness of the patterned layer 50 ($\delta_{PSAF}$) is 44 Å and, as can be seen, there is substantial side reading. For this simulation, the patterned layer 50 is too thick to achieve substantially zero magnetic susceptibility in the wing regions of the free layer 30. In FIG. 7, the thickness of the patterned layer 50 ($\delta_{PSAF}$) is 30 Å and, as can be seen, there is also some side reading. For this simulation, the patterned layer 50 is too thin to achieve substantially zero magnetic susceptibility in the wing regions of the free layer 30.

Figure 8:
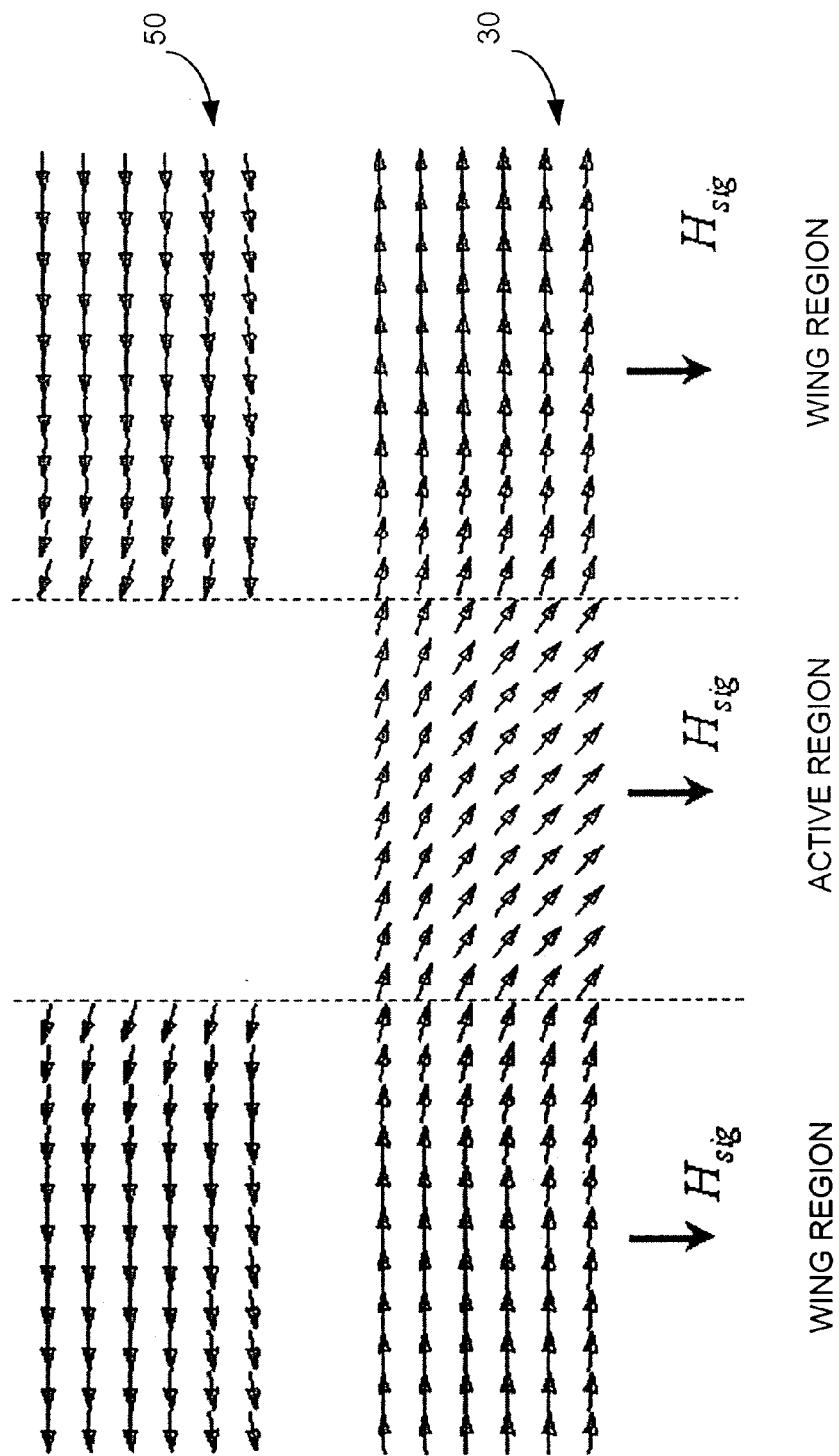
FIGS. 8–10 illustrate the magnetic moment orientations of the free and patterned layers for different signal fields according to one embodiment.
Figure 9:
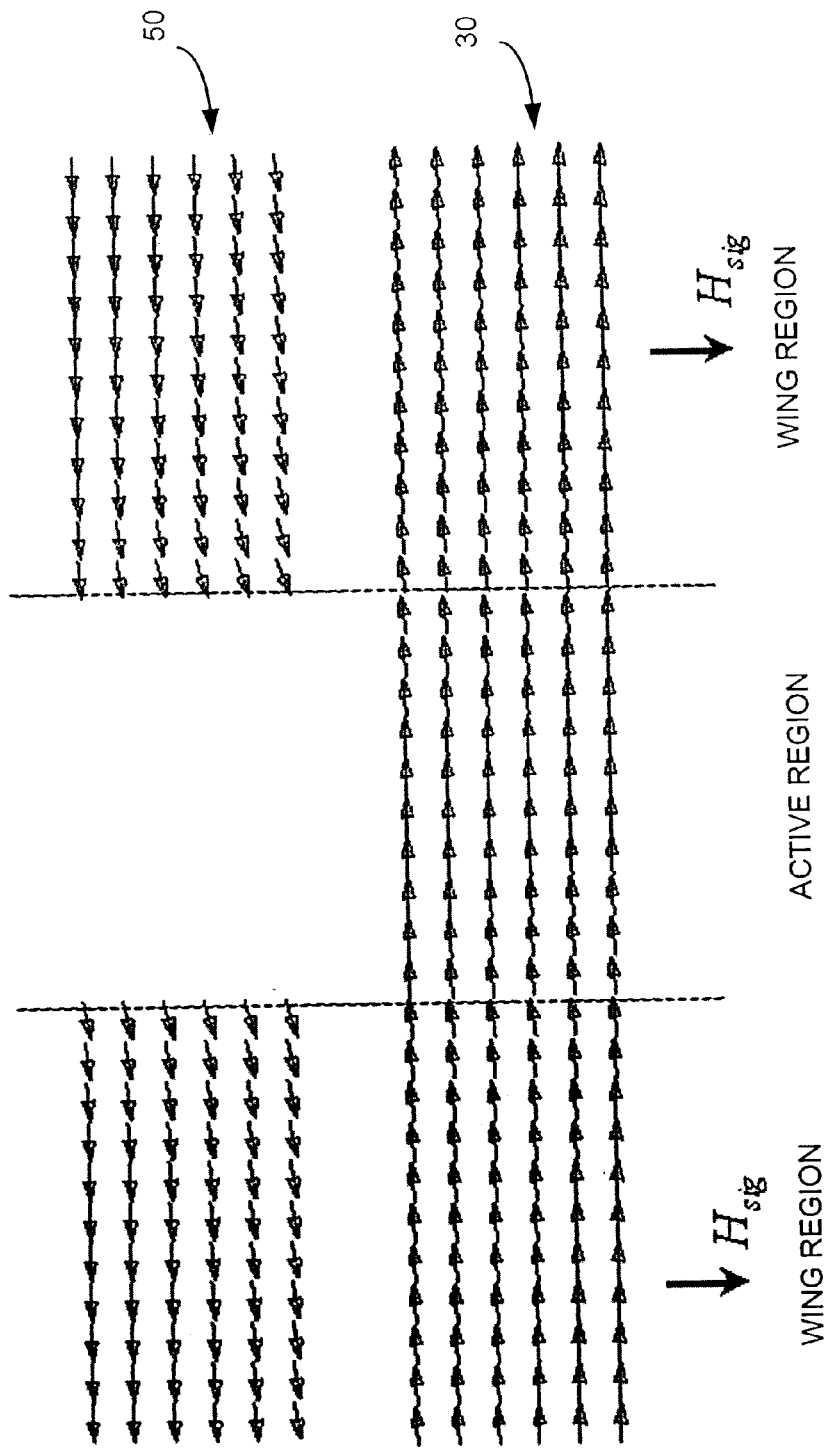
Figure 10:
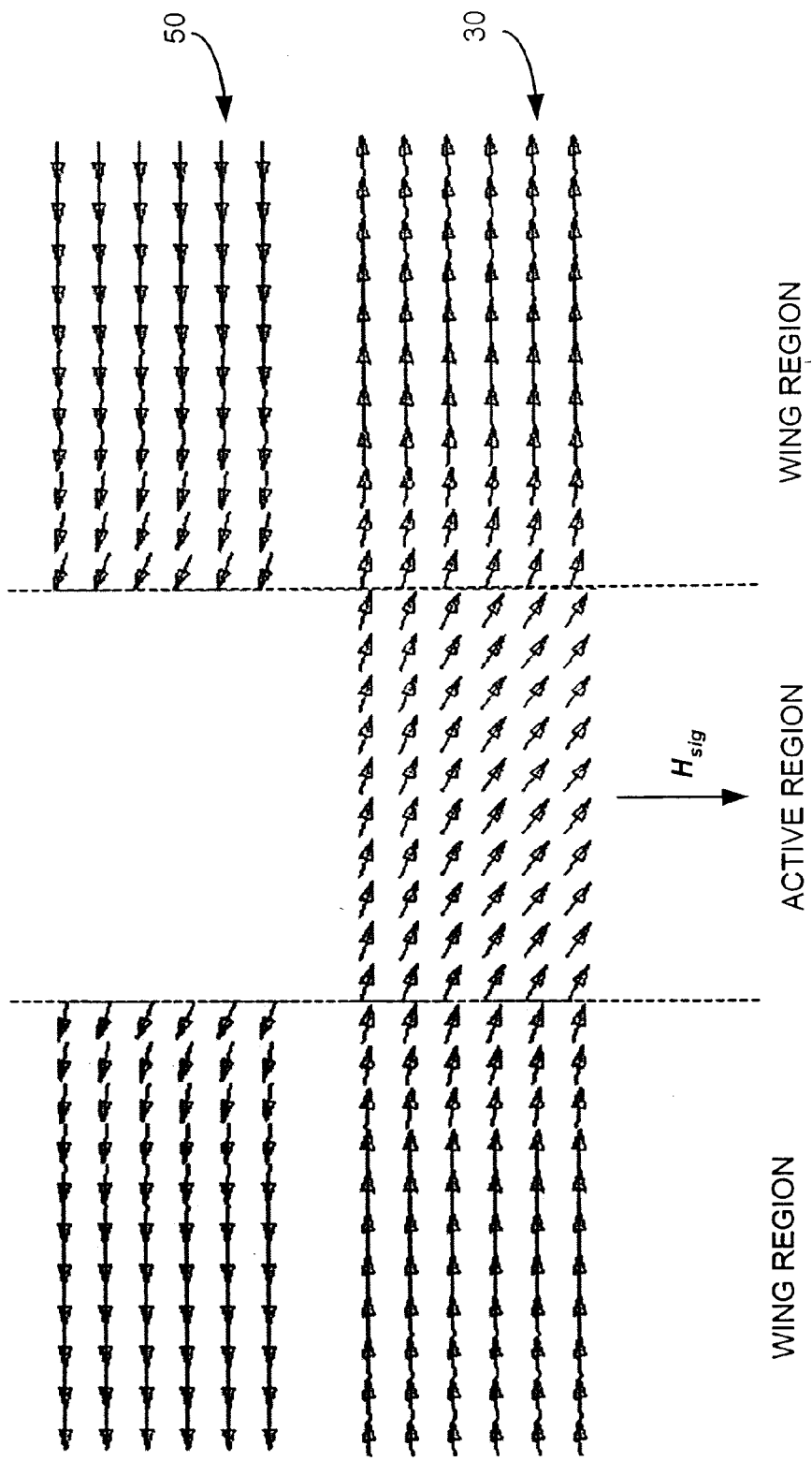

FIGS. 8–10 illustrate magnetic moment simulations of the patterned layer 50 and the free layer 30 for the embodiment of the simulation of FIG. 5, i.e., where the patterned layer 50 has a thickness of 34 Å to realize a substantially side-reading free embodiment. In FIG. 8, the magnetic moment orientations of the patterned and free layers 50, 30 are shown for a magnetic signal ($H_{sig}$) in each of the active region 12 and the wing regions 14. In FIG. 9, the magnetic moment orientations of the patterned and free layers 50, 30 are shown for a magnetic signal ($H_{sig}$) in the wing regions 14 only. As can be seen in FIG. 9, the patterned layer 50 produces a counter-torque to cancel the signal field ($H_{sig}$). As a result, the magnetic susceptibility at the wing regions of the free layer 30 is substantially zero. In FIG. 10, the magnetic moment orientations of the patterned and free layers 50, 30 are shown for a magnetic signal ($H_{sig}$) in the active region 12 only. As can be seen in FIG. 10, the magnetization of the free layer 30 in the wing regions 14 is allowed to rotate near the active region 12, i.e., at the track edge. This allows the magnetization of the free layer 30 in the active region 12 to rotate due to the signal field ($H_{sig}$) to thereby read the data without side reading in the wing regions.

Figure 11:
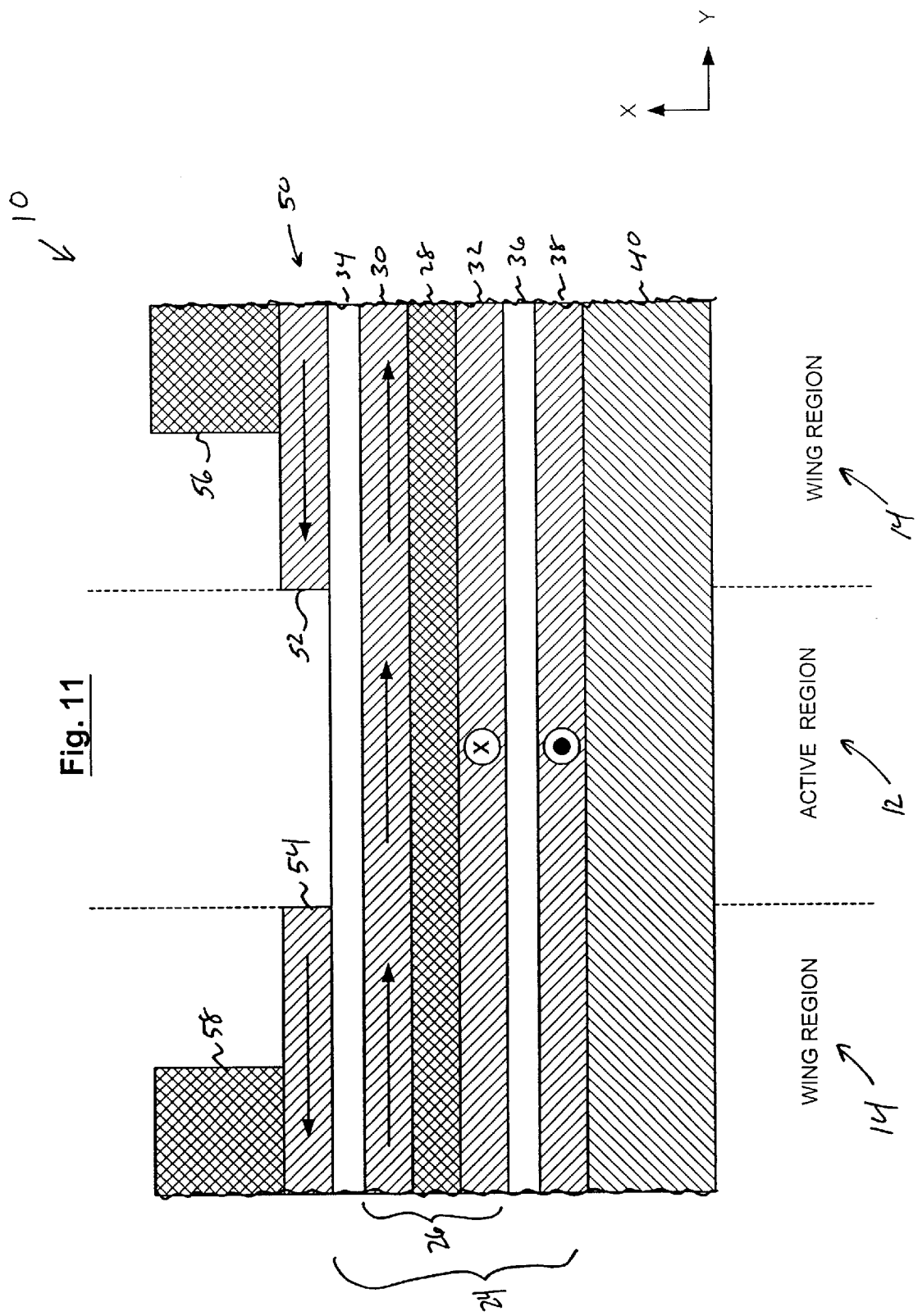
FIGS. 11–15 are bottom views of the read head according to other embodiments of the present invention.

FIG. 11 is a bottom view of the read head 10 according to another embodiment of the present invention. The embodiment illustrated in FIG. 11 is similar to that illustrated in FIG. 2 except that in FIG. 11 the leads 56, 58 are recessed. That is, leads 56, 58 are not patterned onto the wing region portions 52, 54 respectively of the patterned layer 50 to completely cover the wing region portions 52, 54. Rather, as illustrated in FIG. 11 the leads 56, 58 are recessed such that they only cover a portion of the wing region portions 52, 54. As with the embodiment of FIG. 2, the insulating layer 42 (not shown in FIG. 11) may be between the leads 56, 58.

Figure 12:
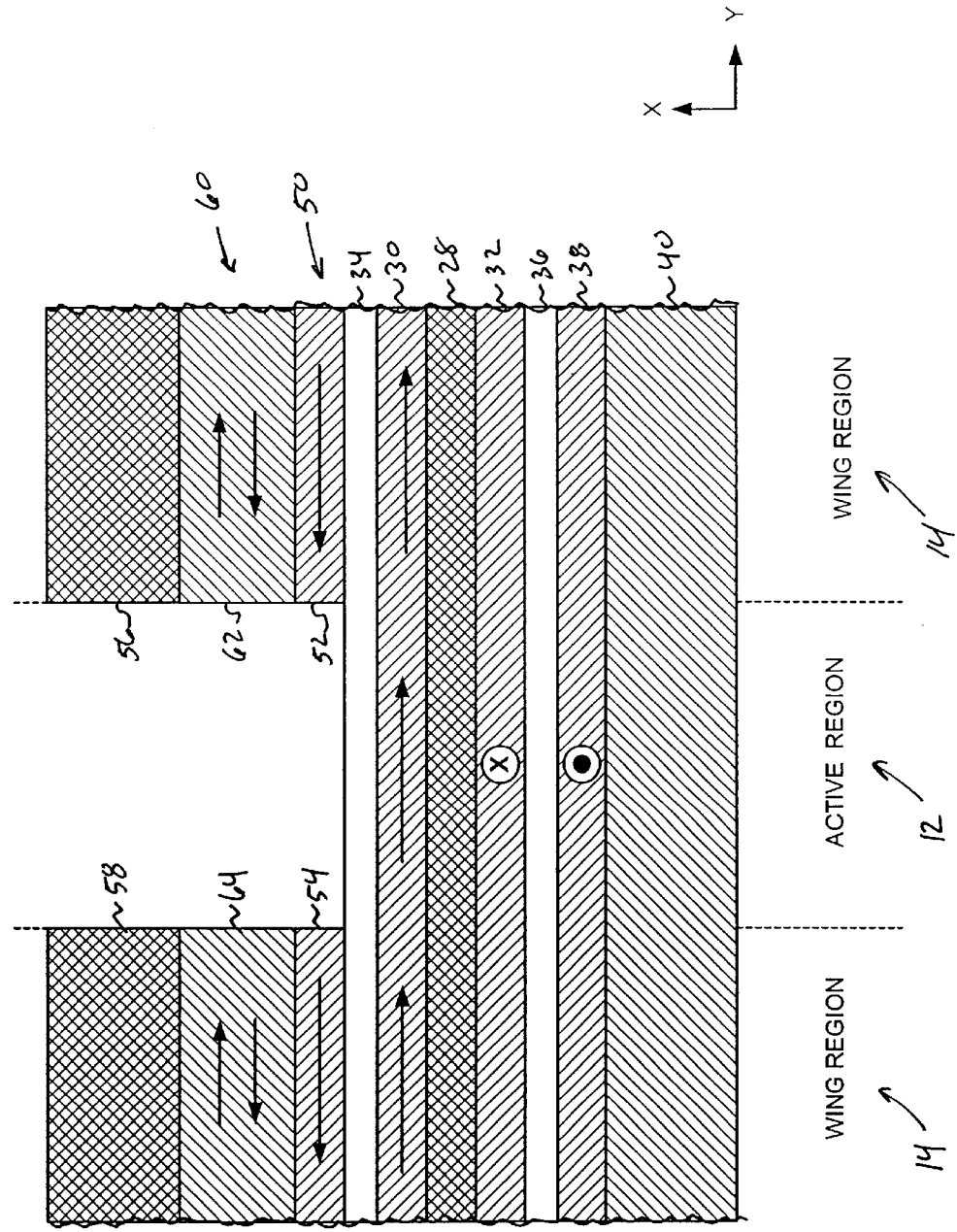

FIG. 12 is a bottom view of the read head 10 according to another embodiment of the present invention. The embodiment illustrated in FIG. 12 is similar to that illustrated in FIG. 2 except that the embodiment of FIG. 12 includes an antiferromagnetic layer 60 patterned onto the patterned layer 50. The antiferromagnetic layer 60 may include a wing region portion 62 adjacent to the wing region portion 52 of the patterned layer 50 and may include a wing region portion 64 adjacent the wing region portion 54 of the patterned layer 50. As illustrated in FIG. 12, the leads 56, 58 may be patterned onto the portions 62, 64 respectively of the antiferromagnetic layer 60. The antiferromagnetic layer 60 may be fabricated from an antiferromagnetic material such as, for example, IrMn, IrPtPd, IrPt or NiMn, with a thickness of, for example, approximately 200 nm, and may provide horizontal exchange pinning for the free layer 30.

Figure 13:
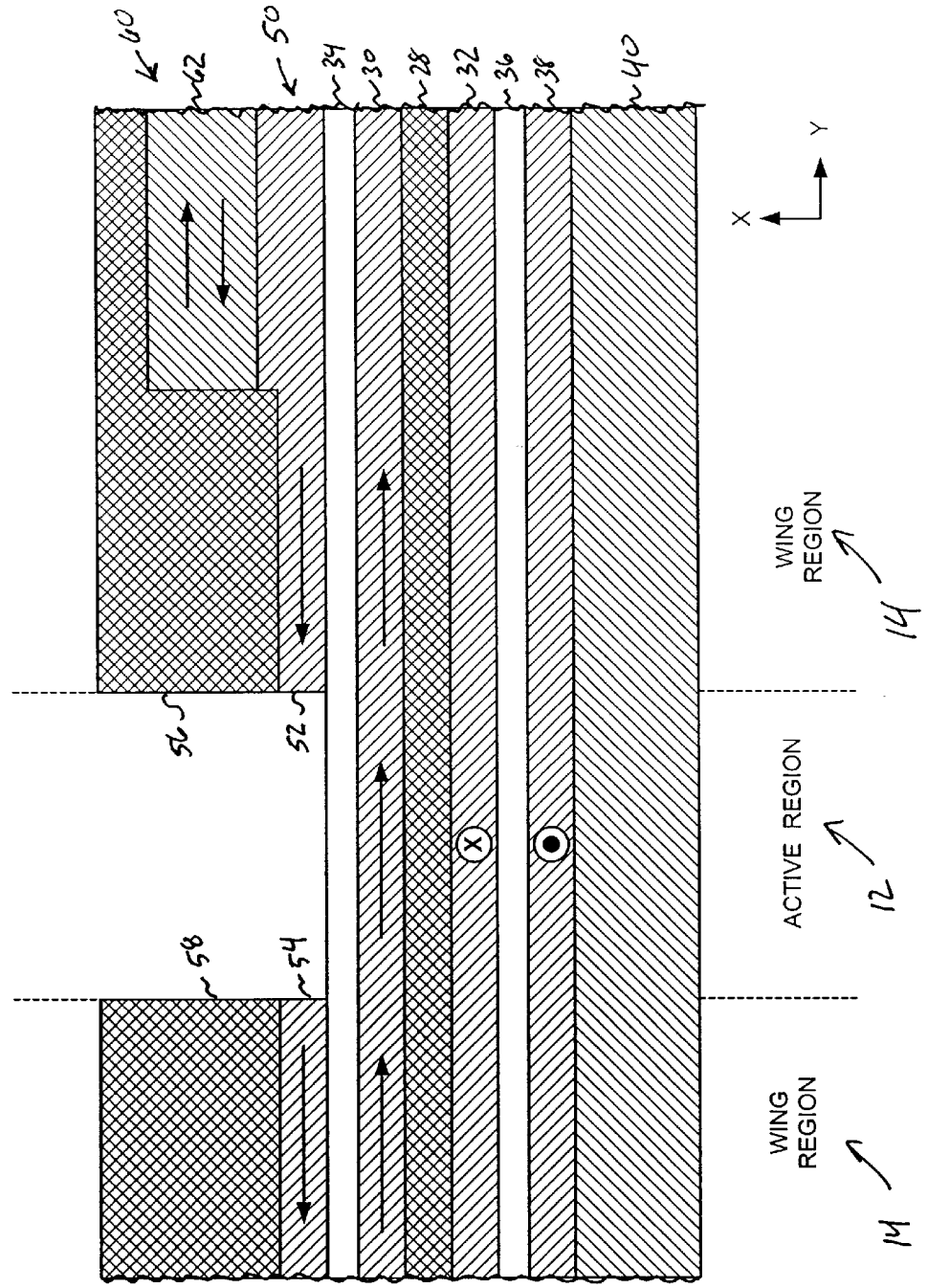

FIG. 13 is a bottom view of the read head 10 according to another embodiment of the present invention. The embodiment illustrated in FIG. 13 is similar to that illustrated in FIG. 12 except that in the embodiment of FIG. 13 the antiferromagnetic layer 60 is recessed. For convenience, only wing region portion 62 of the antiferromagnetic layer 60 is shown in FIG. 13, and according to one embodiment the opposite wing region 14 may also include a recessed antiferromagnetic portion. As illustrated in FIG. 13, according to one embodiment the lead 56 may be patterned onto the recessed antiferromagnetic layer 62.

Figure 14:
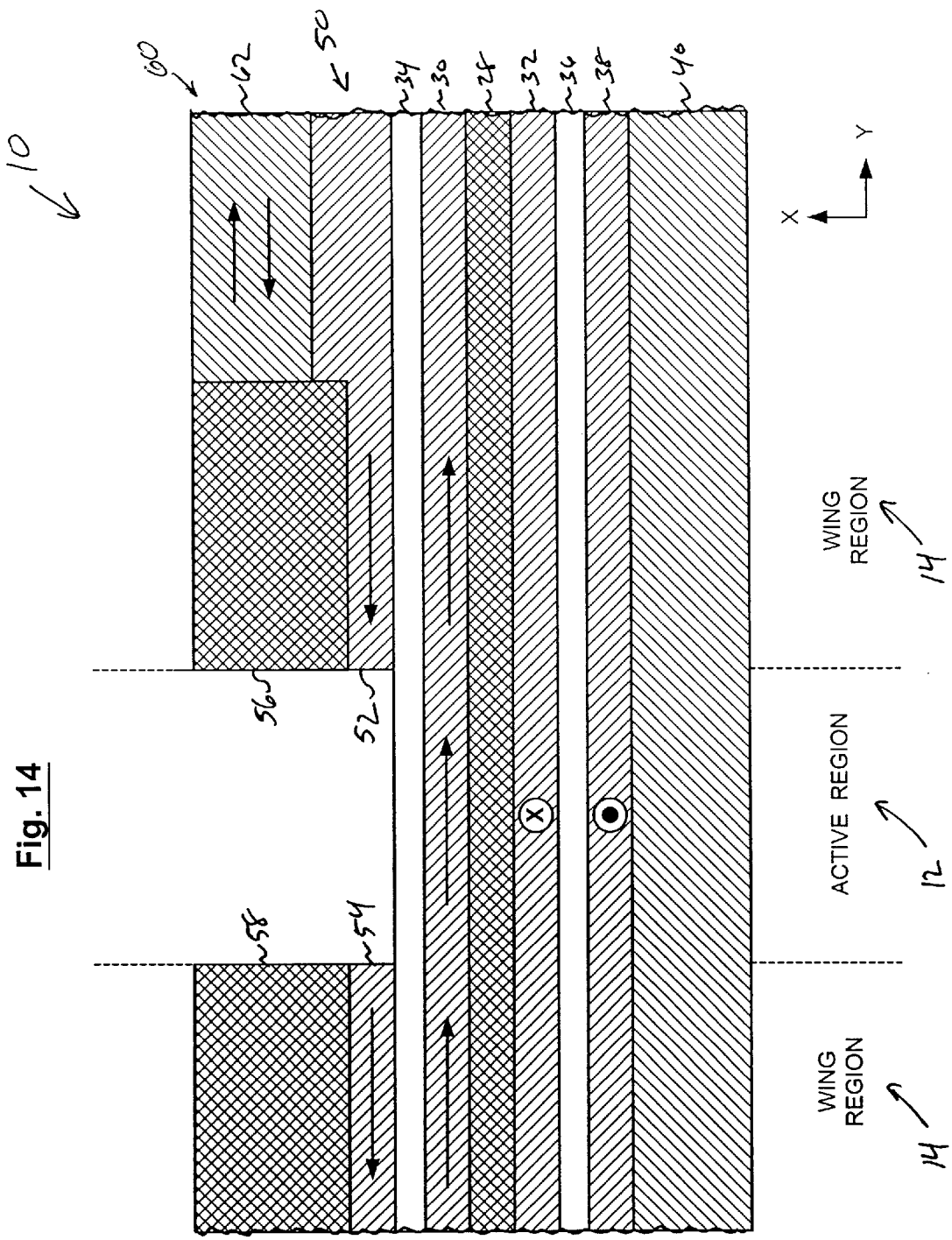

FIG. 14 is a bottom view of the read head 10 according to another embodiment of the present invention. The embodiment illustrated in FIG. 14 is similar to that illustrated in FIG. 13 except that in the embodiment of FIG. 14 the lead 56 is not patterned onto the recessed antiferromagnetic portion 62.

Figure 15:
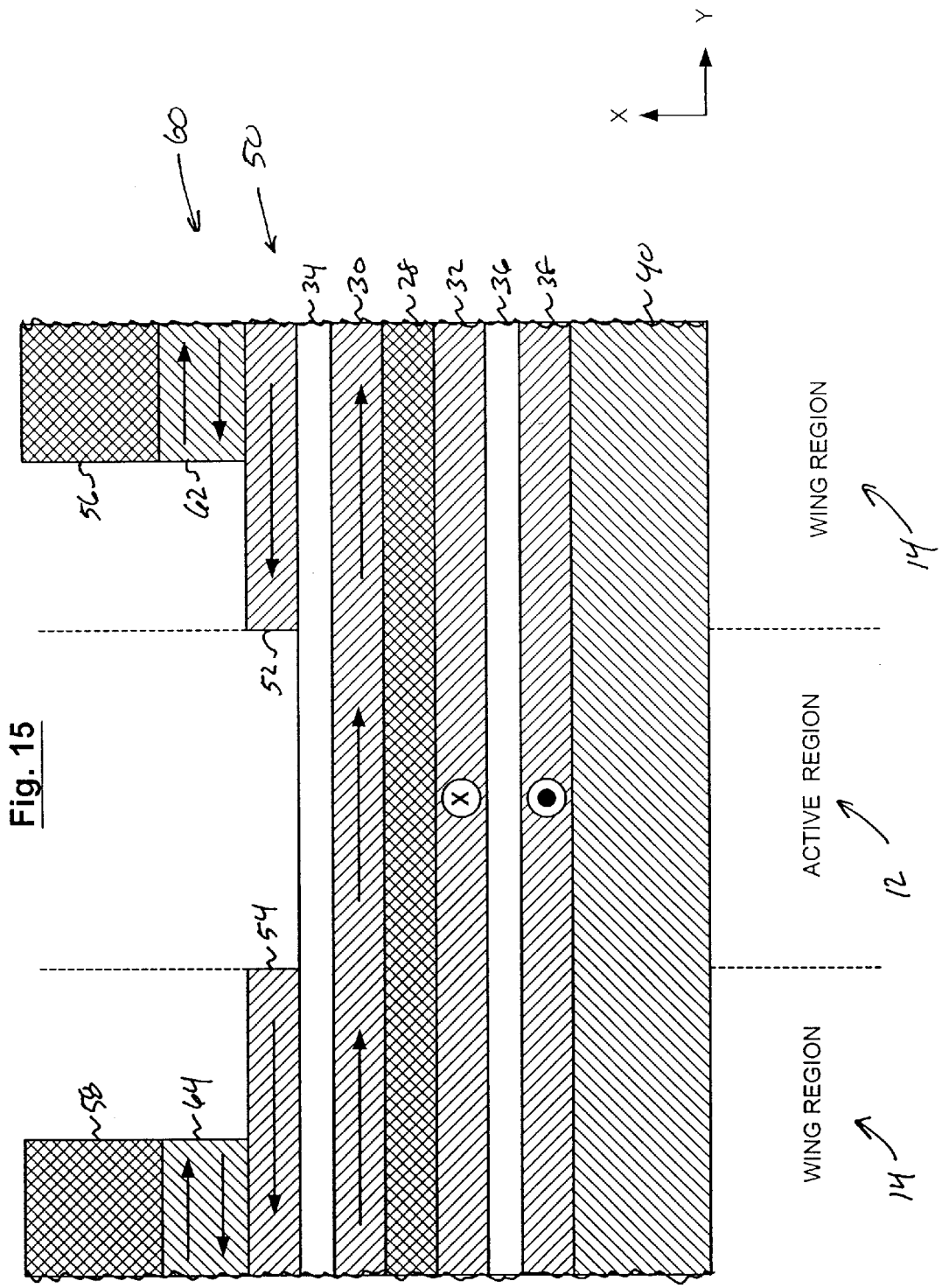

FIG. 15 is a bottom view of the read head 10 according to another embodiment of the present invention. The embodiment illustrated in FIG. 15 is similar to that illustrated in FIG. 11 except that in the embodiment of FIG. 15 the antiferromagnetic layer 60 is patterned onto the Patterned layer 50 and the leads 56, 58 are patterned onto the antiferromagnetic layer 60 such that both the antiferromagnetic layer 60 and the leads 56, 58 are recessed.

Although the present invention has been described herein with respect to certain embodiments, those of ordinary skill in the art will recognize that many modifications and variations of the present invention may be implemented. The foregoing description and the following claims are intended to cover all such modifications and variations.

What is claimed is:

1. A magnetic sensor, comprising a synthetic antiferromagnetic layer having first and second wing regions and an active region therebetween, wherein the synthetic antiferromagnetic layer includes:
   a non-magnetic metal layer having first and second wing region portions and an active region portion therebetween, the non-magnetic metal layer including first and second opposing surfaces;
   a first ferromagnetic layer adjacent a first surface of the non-magnetic metal layer and having first and second wing region portions and an active region portion therebetween; and
   a second ferromagnetic layer adjacent the second surface of the non-magnetic metal layer and including a first wing region portion adjacent the first wing region portion of the non-magnetic metal layer and a second wing region portion adjacent the second wing region portion of the non-magnetic metal layer, wherein the second ferromagnetic layer is of adequate thickness such that the magnetic susceptibility of the first and second wing region portions of the first ferromagnetic layer is substantially zero when magnetic signal fields are present only in the first and second wing regions, wherein the first ferromagnetic layer includes a second surface opposite the first surface and wherein the first ferromagnetic layer is a layer of a giant magnetoresistive tri-layer, the giant magnetoresistive tri-layer further comprising:
- a second non-magnetic metal layer including copper and having first and second opposing surfaces, wherein the first surface of the second non-magnetic metal layer is adjacent the second surface of the first ferromagnetic layer; and
- a third ferromagnetic layer having first and second opposing surfaces, wherein the first surface of the third ferromagnetic layer is adjacent the second surface of the second non-magnetic metal layer, and including a material selected from the group of nickel-iron, cobalt-iron and nickel-iron-cobalt, and wherein the magnetic sensor further includes a third non-magnetic metal layer having a first and second opposing surfaces, wherein the first surface is adjacent the second surface of the third ferromagnetic layer.

2. The sensor of claim 1, wherein the non-magnetic metal layer includes a metal selected from the group consisting of ruthenium and rhodium.

3. The sensor of claim 2, wherein the first ferromagnetic layer includes a material selected from the group of nickel-iron, cobalt-iron and nickel-iron-cobalt.

4. The sensor of claim 3, wherein the second ferromagnetic layer includes cobalt-iron.

5. The sensor of claim 1, further comprising:
- a first lead patterned on the first wing region portion of the second ferromagnetic layer; and
- a second lead patterned on the second wing region portion of the second ferromagnetic layer.

6. The sensor of claim 5, wherein the first and second leads are recessed.

7. The sensor of claim 1, wherein the third non-magnetic metal layer includes a material selected from the group consisting of ruthenium and rhodium.

8. The sensor of claim 7, further comprising:
- a fourth ferromagnetic layer having first and second opposing surfaces, wherein the first surface of the fourth ferromagnetic layer is adjacent the second surface of the third non-magnetic metal layer; and
- an antiferromagnetic layer adjacent the second surface of the fourth ferromagnetic layer.

9. The sensor of claim 1, further comprising:
- an antiferromagnetic layer portion patterned on the first wing region portion of the second ferromagnetic layer; and
- a lead patterned on the antiferromagnetic layer portion.

10. The sensor of claim 9, wherein the antiferromagnetic layer portion is recessed.

11. The sensor of claim 10, wherein the lead is recessed.

12. The sensor of claim 1, further comprising:
- an antiferromagnetic layer portion having first and second opposing surfaces, wherein the first surface of the antiferromagnetic layer portion is adjacent the first wing region portion of the second ferromagnetic layer; and
- a lead having a first portion adjacent the first wing region portion of the second ferromagnetic layer.

13. The sensor of claim 12, wherein the lead includes a second portion adjacent the second surface of the antiferromagnetic layer.

* * * * *